(12) United States Patent
Knab et al.

(10) Patent No.: US 8,633,795 B2
(45) Date of Patent: Jan. 21, 2014

(54) THERMAL FUSE

(75) Inventors: Norbert Knab, Appenweier (DE); Georg Schulze-Icking-Konert, Buehlertal (DE); Thomas Mohr, Buehlertal (DE); Stefan Kotthaus, Sinzheim (DE); Nikolas Haberl, Sinzheim (DE); Stefan Stampfer, Bietigheim-Bissingen (DE); Michael Mueller, Rutesheim (DE)

(73) Assignee: Robert Bosch GmbH, Stuttgart (DE)

( * ) Notice: Subject to any disclaimer, the term of this patent is extended or adjusted under 35 U.S.C. 154(b) by 220 days.

(21) Appl. No.: 12/593,124

(22) PCT Filed: Feb. 1, 2008

(86) PCT No.: PCT/EP2008/051286
§ 371 (c)(1),
(2), (4) Date: Sep. 25, 2009

(87) PCT Pub. No.: WO2008/116685
PCT Pub. Date: Oct. 2, 2008

(65) Prior Publication Data
US 2010/0109833 A1    May 6, 2010

(30) Foreign Application Priority Data

Mar. 26, 2007 (DE) .......................... 10 2007 014 338

(51) Int. Cl.
*H01H 37/76* (2006.01)
*H01H 69/02* (2006.01)

(52) U.S. Cl.
USPC ........... 337/159; 337/160; 337/180; 337/181; 337/290; 337/296; 337/413

(58) Field of Classification Search
USPC ......... 337/152, 159, 160, 180, 181, 290, 158, 337/296, 413; 29/623; 148/400; 420/561, 420/562, 559, 577
See application file for complete search history.

(56) References Cited

U.S. PATENT DOCUMENTS

| | | | |
|---|---|---|---|
| 2,762,889 A | 9/1956 | Waller | |
| 3,354,282 A | 11/1967 | Batsch | |
| 3,377,448 A | 4/1968 | Baumbach | |
| 4,198,617 A * | 4/1980 | Hara | 337/403 |
| 6,040,754 A * | 3/2000 | Kawanishi | 337/297 |
| 6,064,293 A * | 5/2000 | Jungst et al. | 337/290 |
| 6,222,438 B1 * | 4/2001 | Horibe et al. | 337/290 |
| 6,774,761 B2 * | 8/2004 | Tanaka | 337/296 |

(Continued)

FOREIGN PATENT DOCUMENTS

| | | |
|---|---|---|
| DE | 15 88 425 | 5/1971 |
| DE | 196 15 643 | 10/1997 |

(Continued)

*Primary Examiner* — Anatoly Vortman
(74) *Attorney, Agent, or Firm* — Merchant & Gould P.C.

(57) ABSTRACT

The invention relates to a thermal fuse in a circuit structure, particularly a punched grid, having a plurality of circuit areas, having the circuit structure with connections sites (9) and having a fusible element (3), which is electrically and mechanically connected to the connection sites (9) of the circuit structure, a material of the fusible element (3) having a melting point, in order to melt at an ambient temperature greater than the melting point, such that material of the fusible element (3) collects at the connection sites (9) and the electrical connection formed by the fusible element (3) breaks.

6 Claims, 5 Drawing Sheets a)

b)

(56) References Cited

U.S. PATENT DOCUMENTS

| | | | |
|---|---|---|---|
| 6,774,791 | B2 | 8/2004 | Krubiner et al. |
| 7,042,327 | B2 * | 5/2006 | Tanaka et al. ............... 337/290 |
| 7,064,648 | B2 * | 6/2006 | Tanaka ........................ 337/290 |
| 7,068,141 | B2 * | 6/2006 | Senda et al. ................ 337/405 |
| 7,142,088 | B2 * | 11/2006 | Tanaka ........................ 337/290 |
| 7,199,697 | B2 * | 4/2007 | Tanaka ........................ 337/159 |
| 2002/0113685 | A1 * | 8/2002 | Izaki et al. .................. 337/405 |
| 2004/0038561 | A1 * | 2/2004 | Topp et al. ..................... 439/67 |
| 2011/0181385 | A1 * | 7/2011 | Schulze-Icking-Konert et al. ........................... 337/290 |

FOREIGN PATENT DOCUMENTS

| | | | | |
|---|---|---|---|---|
| DE | 102008040345 A1 * | 1/2010 | ............ | H01H 37/76 |
| EP | 0 715 483 | 6/1996 | | |
| EP | 0 786 790 | 7/1997 | | |
| JP | 57-186954 | 11/1982 | | |
| JP | 01176620 A * | 7/1989 | ............ | H01H 37/76 |
| JP | 02288126 A * | 11/1990 | ............ | H01H 37/76 |
| JP | 10-208607 | 8/1998 | | |
| JP | 2000-138022 | 5/2000 | | |
| JP | 2001-297685 | 10/2001 | | |
| JP | 2002-184279 | 6/2002 | | |
| JP | 2004-152518 | 5/2004 | | |

* cited by examiner

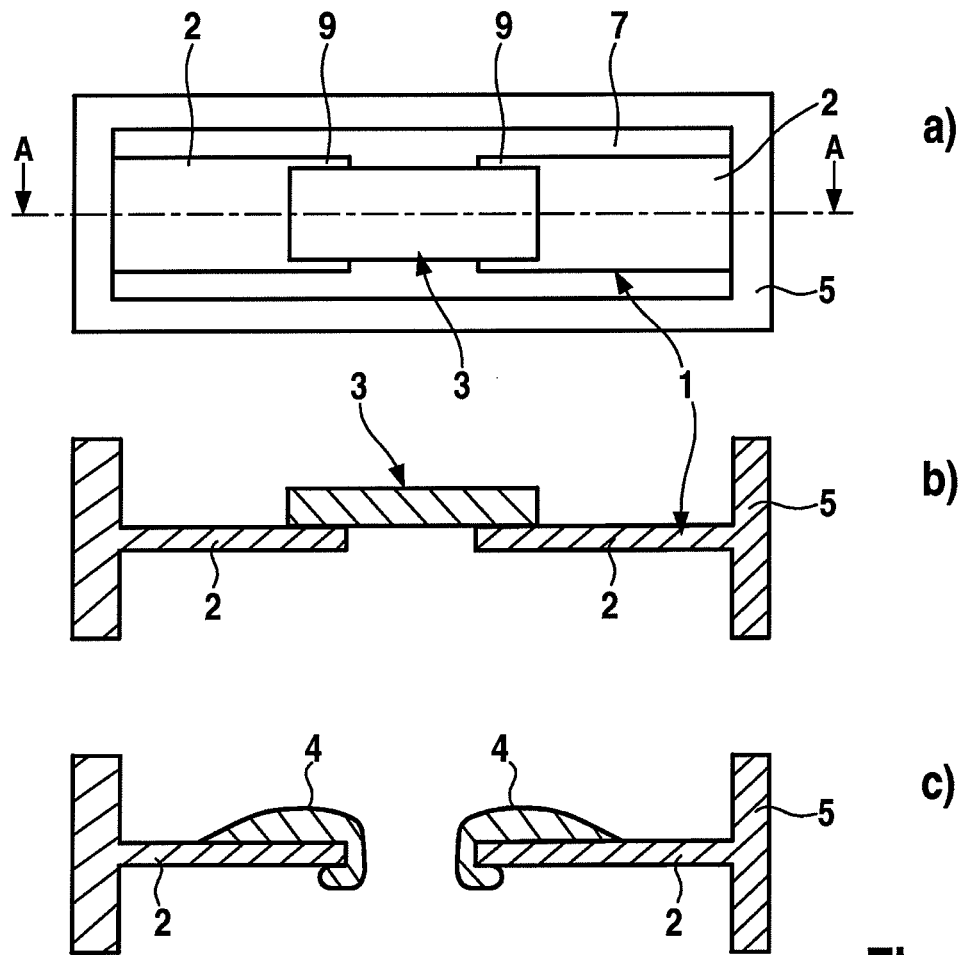
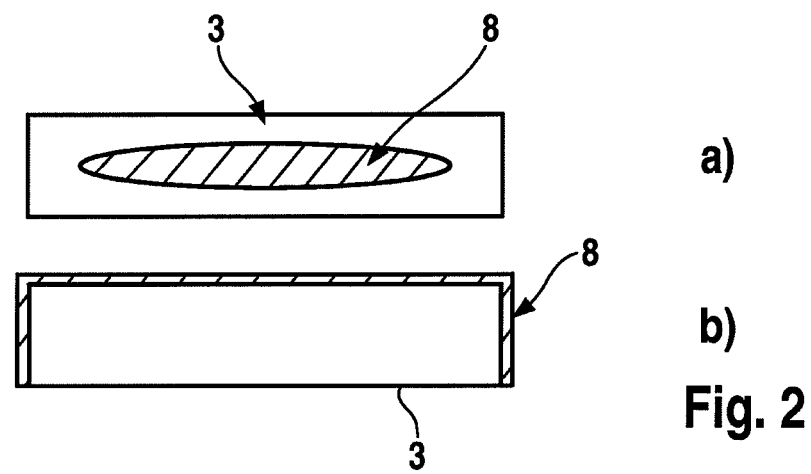

THERMAL FUSE

This application is a National Stage Application of PCT/EP2008/051286, filed 1 Feb. 2008, which claims benefit of Serial No. 10 2007 014 338.0, filed 26 Mar. 2007 in Germany and which applications are incorporated herein by reference. To the extent appropriate, a claim of priority is made to each of the above disclosed applications.

BACKGROUND

The invention relates to a thermal fuse for interrupting a current flow in modules, which can, in particular, be used in the automotive field.

In order to protect a module from overheating, irreversible thermal fuses are required, which interrupt (trigger) a current conductor at an ambient temperature that is too high. The thermal fuses are constructed so that they cannot be triggered by a high current, but exclusively by a high ambient temperature. A thermal fuse also serves for providing an independent switch-off path for electrical modules, which securely interrupts the current flow at improperly high temperatures in the module, for example due to failures of components or shorts, for example caused by external influences, malfunctioning of isolation materials and such alike.

Usual thermal fuses are mostly based on the concept of a fixed spring, for example, a soldered leaf spring, which opens a contact in the case of a triggering by a spring force. Thereby, a permanent and mechanic force is exerted on the connection site in an un-triggered state, which, for example, causes quality issues, especially at long operating times in the automotive field. In particular, a disruption of the soldering point can occur after some time.

SUMMARY

It is the task of the present invention to provide a thermal fuse, which securely interrupts a current flow at improperly high ambient temperatures, which, for example, occur at failures of components, shorts or external influences, or malfunctioning of isolation materials. The thermal fuse shall generally be triggered depending on the ambient temperature and not on the current flow through the thermal fuse. In this way, failures, which cause only currents smaller than the allowed maximum currents, can be recognized. According to the invention, the thermal fuse shall furthermore provide a high reliability, in particular, during a long lifetime.

According to one aspect, a thermal fuse is provided in a circuit structure, in particular, in a punched grid or a conductor plate, with several circuit areas. The circuit areas of the thermal fuse provide corresponding connection sites. Furthermore a fusible element is provided, which is electrically and mechanically connected to the connection sites of the circuit structure, whereby the material of the fusible element provides a melting temperature, in order to melt at an ambient temperature that is higher than the melting temperature, so that material of the fusible element accumulates at the connection sites and the electrical connection that is created by the fusible element separates.

The above thermal fuse can be placed easily by electrical connections of a fusible element between connection sites of a punched grid.

Furthermore, the connection sites are distanced from each other. The melted material of the fusible element is electrically separated from each other at the connection sites.

Preferably, the fusible element is soldered, welded, connected or glued to the connection sites.

Furthermore the fusible element can be covered with a soldering flux and/or provide a soldering flux in a hollow on the inside of the fusible element. Soldering flux that is enclosed on the inside of the fusible element has the advantage of reduced aging.

Furthermore, the connection sites can be arranged at corresponding contact bridges of the circuit structure, whereby the contact bridges provide a spring element and/or whereby at least one of the contact bridges provides a bending or curving regarding the direction that is defined by the connection sites.

According to an embodiment, the circuit structure can provide one or several idle power sections, which do not contribute to the current flow, and/or one or several cross sections, which span transversely to a connection direction that is defined by the connection sites and are connected with an idle power section or a circuit section.

Furthermore, the fusible element can be construed in the form of a rectangle or provide a U-formed or a S-formed section, in order to increase the resilience of the fusible element, so that a traction force or a compression force can be absorbed. Furthermore, the local deformation can thereby be minimized in order to minimize a fatigue by a repeated deformation.

According to an embodiment, the fusible element is made of a deformable material. The deformation force for deforming the fusible element is lower than a minimum force, which causes a degradation of the fusible element and/or the connection between the connection site and the fusible element.

Furthermore, the connection sites can be provided in contact elements, which each provide a conductive contact capsule and a connection line that is connected to it. The ends of the fusible element are inserted into the contact capsules and are each electrically connected with the contact capsule with the aid of a contact material.

According to a further aspect, a thermal fuse is provided in a circuit structure. The thermal fuse comprises a contact element, which has a conductive contact capsule and a connection line that is connected to it, as well as a fusible element, in which a soldering flux is embedded, whereby one end of the fusible element is inserted into the contact capsule and there electrically connected to the contact capsule with the aid of a contact material.

Furthermore, the soldering flux can be provided as soldering flux core in the material of the fusible element or an interlayer between two layers of the material of the fusible element.

Moreover, the contact material can be a soldering material, which provides a melting temperature that is equal to the melting temperature of the material of the fusible element or a melting temperature that is lower than the melting temperature of the material of the fusible element.

According to a further aspect, a procedure for producing a thermal fuse is provided. The procedure comprises the melting of a contact material in a contact capsule of a contact element by a heat source, the removing of the heat source, and, simultaneously with or after the removing of the heat source, the insertion of a fusible element into the contact capsule, whereby the fusible element is partially melted and connects with the contact capsule over the contact material.

BRIEF DESCRIPTION OF THE DRAWINGS

Preferred embodiments of the invention are further explained with the aid of the attached drawings. It is shown in:

FIGS. 1a to 1c show a thermal fuse in a perspective view, in a cross-sectional view and in a triggering-state;

FIGS. 2a and 2b embodiments for configuring the fusible element according to the embodiments of the invention;

DETAILED DESCRIPTION

Figure 3:
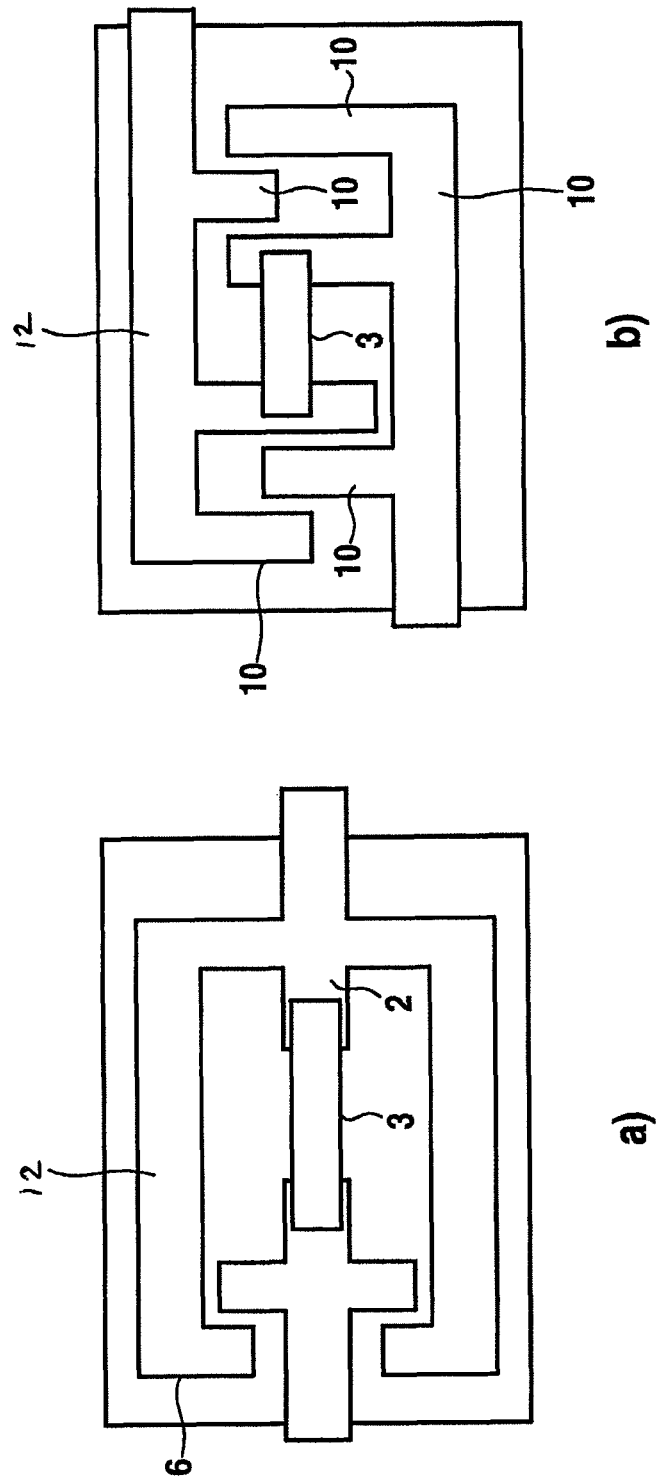
FIGS. 3a and 3b further embodiments of the invention with different configurations of the punched grid.

FIG. 1a shows a perspective view on a section of a punched grid 1 with a circuit structure with conductive elements for conducting an electric current. Such punched grids 1 are used in the automotive field for producing connection elements, at which single electric components shall be placed between the conducting elements of the punched grid 1. The circuit structure of the punched grid 1 is surrounded by a sheathing 5 made of plastic material, which fixes the individual conductive elements and protects them from corrosion. In a recess 7 in the sheathing 5, two contact bridges 2 are not covered by the sheathing 5 as parts of the circuit structure. Thus, in the area of the two contact bridges 2, the circuit structure is exposed.

FIG. 1b shows the punched grid 1 of FIG. 1a along the intersecting line A-A. The exposed contact bridges 2 are electrically connected with each other, as seen in FIG. 1b, over corresponding connection sites 9 by a conductive fusible element 3, in order to create a thermal fuse in the punched grid 1. In the shown embodiment, the fusible element 3 is rectangular or in the shape of a bar made of a easily fusible, electrically well conducting metal or a metal alloy or a material which conducts current well and has a low melting point below 300° C. and below 250° C. or preferably below 200° C. With regard to its melting point and its conductivity the material of the fusible element 3 is so selected that a melting of the fusible element 3 can be securely excluded in normal operation at a low ambient temperature by a high current flow on the one hand, and that it securely melts at a high ambient temperature above a threshold temperature on the other hand.

The material of the fusible element 3 is further selected so that it has a surface tension in melted state, which causes a contracting of the material of the fusible element 3 on the connection sites 9 after melting in the embodiment that is shown in FIG. 1b. This causes a separation of the current path through the fusible element 3. FIG. 1c shows the material of the fusible element 3, which has accumulated in a drop-shape at the connection sites 9 of the contact bridges 2 due to its surface tension. The distance between the ends of the contact bridges 2 that are pointed at each other is thereby so selected that drops 4 of the melted material of the fusible element 3 cannot come into contact with each other in the case of a triggering.

When selecting the material of the fusible element 3, certain factors are considered such as: an easy processing, reliability in normal operation, and a secure triggering in the case of an error even after a longer operating time. Possible materials are, for example, solders or other easily fusible (at low temperatures between 100° C. and 300° C. fusible) materials.

Such possible material can be, for example, SnSb- or SnPb-solders, which have a significant ageing period. In that case, the fusible element 3 can be provided with a soldering flux 8, as it is shown in FIGS. 2a and 2b, which is provided within the fusible element 3 (FIG. 2a) or as a layer outside of the fusible element 3 (see FIG. 2b) for example by dipping. In the case of FIG. 2a an ageing of the soldering flux can be reduced by enclosing the soldering flux for example in a hollow in the fusible element 3. Also an absorbing of the soldering flux between two layers of the material of the fusible element 3 is alternatively possible.

When attaching the fusible element 3, it has to be paid attention on the one hand to a good electrical conductivity, and on the other hand, to the fact that the fusible element 3 is held reliably at the circuit areas 2. Possible connection techniques are, for example, soldering with a solder, whose melting temperature is lower than the melting temperature of the fusible element. The soldering can, for example, be carried out with the aid of a laser or other known soldering procedures, whereby also the direct soldering of the fusible element by a local melting is possible, so that the placing of the soldering material for example in the form of a soldering paste can be waived under circumstances. The local melting can for example be carried out by conducting current pulses, by laser heating, induction, heat conducting, hot air or heat radiation.

A further possibility to connect the fusible element 3 with the contact bridges 2 is to glue it with conductive glue. This is in particular advantageous if the fusible element 3 is provided with an adhesive layer and/or oxidization layer, which impedes a soldering. In addition to the gluing, a bonding process can be carried out, at which a bonding wire is connected between the fusible element 3 and the corresponding contact bridge 2 in order to connect the fusible element 3 electrically with the contact bridges 2 of the punched grid 1 in a reliable way.

Further possibilities are the connecting of the fusible element 3 with the contact bridges 2 by friction welding, diffusion- and ultra-sound-welding, laser welding and such alike. Alternatively, the fusible element 3 can also be connected with the circuit areas 2 of the punched grid 1 by a mechanic clamping, for example by crimping or insulation displacement.

At the arrangement of the fusible element 3 on the punched grid 1 it has to be paid attention to the fact, that mechanic tensions by a subsequent processing, which are caused at temperature variations, as for example over-molding the punched grid 1 with a plastic material, in order to create a sheathing, stay low during operation. Mechanic tensions can cause a degradation of the fusible element or a disruption or degradation of the connection between the fusible element 3 and the contact bridges 2 (for example the soldering point).

In order to avoid an oversized exposure of the fusible element 3 due to mechanic tensions of the conductor paths in the punched grid 1, and thereby increasing the reliability of the thermal fuse, the punched grid 1 can, as it is shown in FIGS. 3a and 3b, include a relief structure in addition to the circuit structures of the punched grid 1, which ensures a better fixing in the sheathing 5. Moreover, the relief structures of the punched grid 1 can engage with each other and/or completely or partially enclose the area that has to be relieved from the mechanic tensions, so that mechanic tension is released by the relief structures to the sheathing 5. In reverse, mechanic tension coming from the sheathing 5 can also be absorbed by the relief structures.

As it is shown in FIG. 3a, the engaging of the relief structures into each other is realized by providing idle power sections 6 that are connected with the conductor paths, which illustrate the sections that are embedded in the sheathing 5, which are arranged transversely to a connection direction of the fusible element 3, which means transversely to the direction of the current conduction between the two connection sites 9 of the fusible element. The connection direction of the fusible element 9 is defined by the direction of the connection sites 9, at which the fusible element 3 is connected with the contact bridges 2.

One or both conductor paths, which lead to the corresponding contact bridges 2, provide furthermore a line arm section 12, which goes on the side of the contact bridges 2 and the fusible element 3 and which is provided with the corresponding idle power section 6, which sticks out from the line arm section 12 transversely in the direction towards the corresponding other conductor path, without contacting it. Thus the fusible element 3 and the corresponding contact bridges 2 are at least partially enclosed by the line arm sections and the idle power section 6, so that mechanic tensions in the plastic sheathing, in which the line arm section 12 and also idle power section 6 are embedded, can be absorbed.

FIG. 3b shows a further embodiment, whereby the conductor paths, which are connected to the corresponding contacts of the fusible element 3, each provide cross-sections 10, which engage with each other with regard to the connection direction of the fusible element 3, which means alternating between one of the conductor paths and another conductor path. Two adjoining cross-sections 10 create thereby the contact bridges 2 for connecting the fusible element 3. The cross-sections 10 can be so elected that the direction of the current flow in the fusible element 3 runs opposite to the direction of the current flow of the adjoin conductor element 2.

Figure 4:
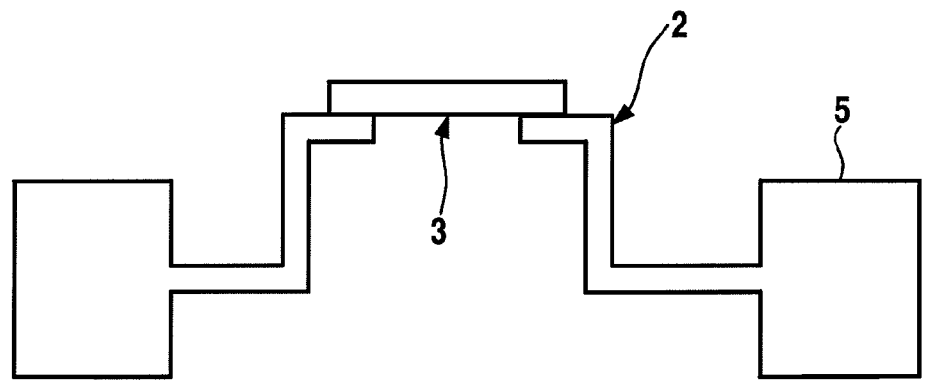
FIG. 4 an illustration of a further embodiment of the thermal fuse according to the present invention.

A further possibility to avoid a force impact on the fusible element 3 and on the connection sites 9 with the contact bridges 2, in particular traction force and compression force, is to provide the conductor paths of the punched grid 1 with an additional spring element or a corresponding form, as it is shown in FIG. 4, which qualifies for catching a force that works in the direction of the fusible element 3. It can for example be provided, that one or several of the contact bridges 2 have a bending or curving in order to create an increased elasticity in the direction of the traction and compression. Thereby the corresponding contact bridges 2 can slightly bend at a force impact due to the increased elasticity without interrupting the electrical connection and thereby reduce the exposure of the fusible element 3 or its contacting.

Figure 5:
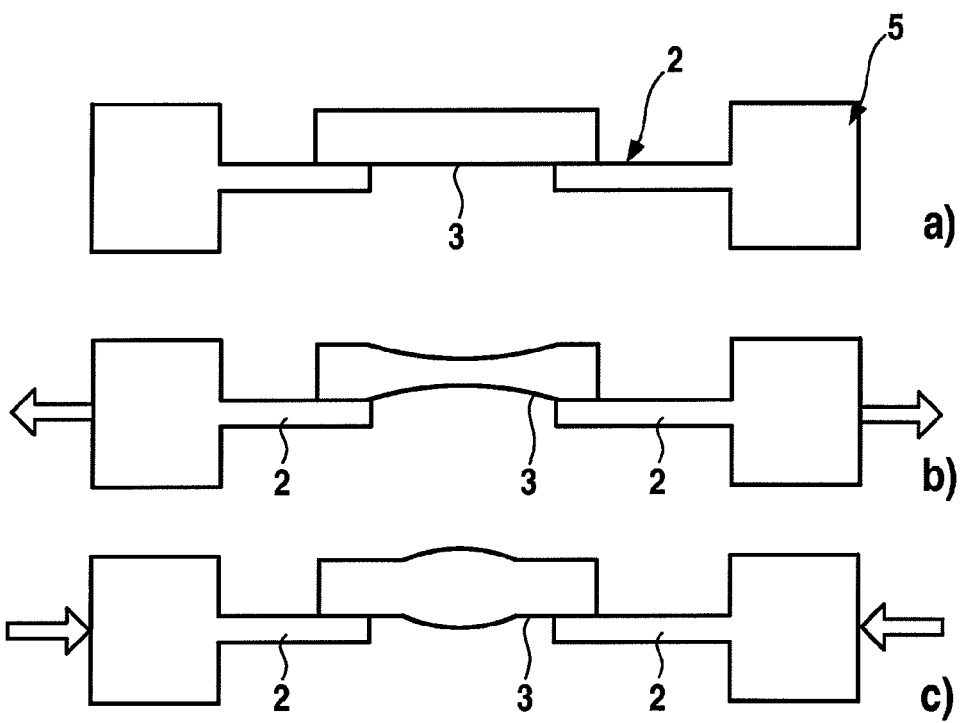
FIGS. 5a to 5c a schematic illustration of a thermal fuse while using a fusible alloy block from a ductile module.

As it can be seen in FIGS. 5a to 5c a ductile material can be provided as material for the fusible element 3, which deforms correspondingly upon a traction force (see FIG. 5b) or a compression force (see FIG. 5c), and thereby reduce the exposure of the connection sites 9 between the fusible element 3 and the contact bridges 2.

Figure 6:
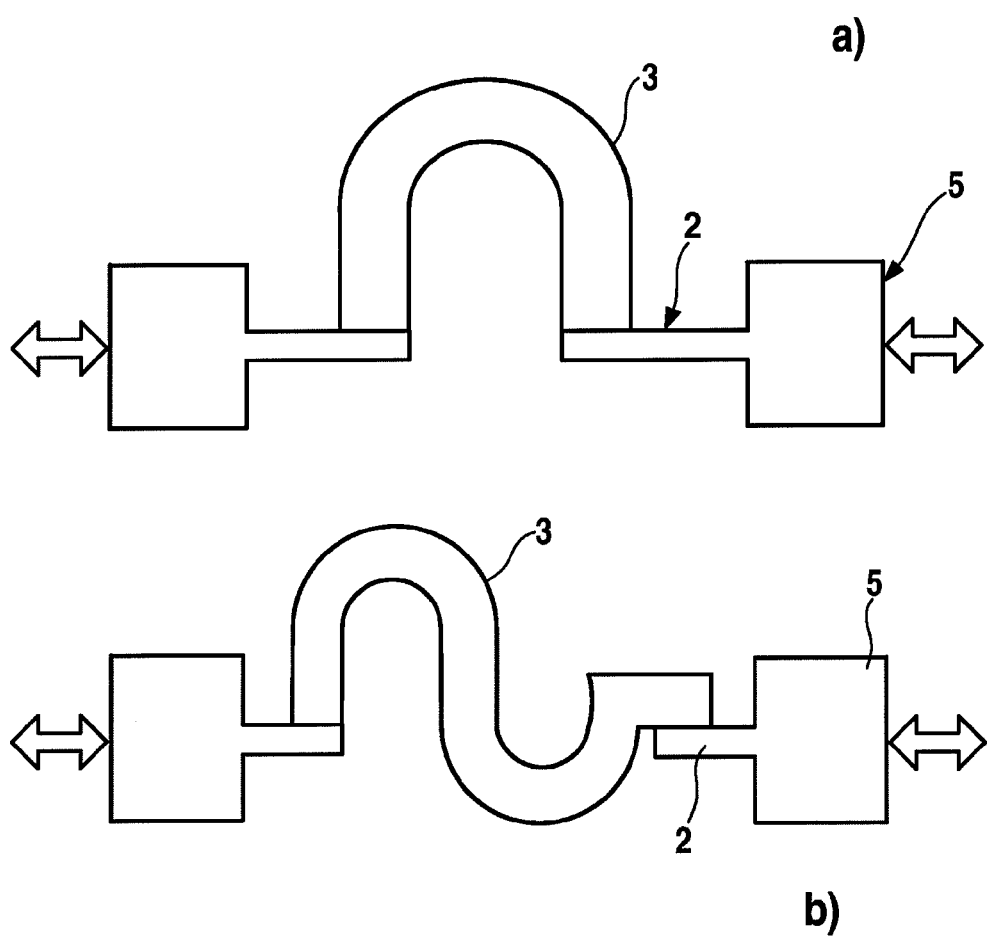
FIGS. 6a and 6b further embodiments of the thermal fuse according to the present invention, at which a plastic deformation of the punched grid is reduced in a ductile way by the fusible alloy block.

While the fusible element 3 had the shape of a bar in the previous embodiments, it is possible according to further embodiments, which are shown in FIGS. 6a and 6b, to also provide a fusible element 3 that is U-shaped or S-shaped between the connection sites 9 of the contact bridges 2, so that a mechanic exposure can be absorbed in a ductile way (easily deformable) in horizontal as well as in vertical direction without having to provide an especially ductile material as in the embodiment in FIG. 4. Thereby a force does not work directly in connection direction of the fusible element 3 upon the connection sites 9, whereby their reliability and long-term stability is significantly increased. Furthermore the deformation of the fusible element 3 is distributed at a correspondingly relative movement between the connection sites 9, so that a material fatigue is reduced.

Figure 7:
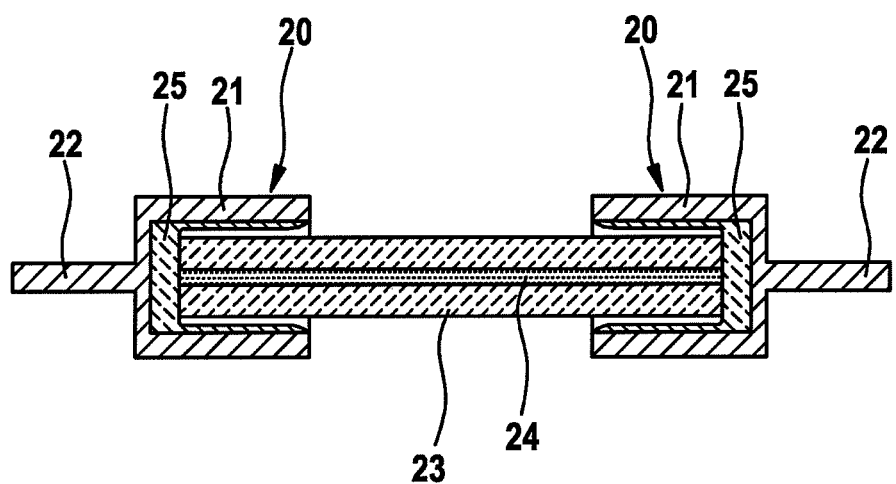
FIG. 7 a further embodiment of the thermal fuse according to the present invention.

FIG. 7 shows a further embodiment, at which two contact elements 20 are provided instead of one punched grid as circuit structure. The two contact elements 20 are each arranged with a one-sided open contact capsule 21, which is provided with a connection wire 22 as connection line for contacting the thermal fuse. The contact elements 20 are conductive and preferably made of a metallic material.

In an open end of the contact capsule 21 one end of the fusible element 23 is absorbed, whose functioning corresponds with the fusible elements, which have been described in the previous embodiments. The fusible element 23 can provide one of the previously mentioned materials for fusible elements. In the shown embodiment the fusible element 23 is made of a soldering material, in which a core of soldering flux 24 is enclosed, which spans between the ends of the fusible element 3. Alternatively the soldering flux can be arranged as interlayer between two layers of the material of the fusible element 23, which sans between the ends of the fusible element 23. In the first mentioned case, the fusible element 23 can preferably provide a round cross-section and be inserted into cylinder-shaped contact capsules 21.

The connection between the contact capsules 21 and the corresponding ends of the fusible elements 23 can take place by a contacting solder 25, which melts at a temperature that is lower than the melting temperature of the material of the fusible element. The mounting of such a thermal fuse can also be carried out by inserting a soldering paste from the contacting solder 25 into the contact capsule 21 and subsequently inserting the corresponding end of the fusible element 23 into the capsule, so that it encloses the soldering paste between the enclosed ends of the contacting capsule 21 and the end of the fusible element 23. By a temperature step (heat supply) the soldering paste is now melted, whereby the temperature is so selected that it does not melt the material of the fusible element 23. The contact capsules 21 can also provide rectangular or other cross-sections instead of a cylinder-shaped cross-section, which qualify for absorbing correspondingly formed fusible elements 23.

Hereby a thermal fuse is created, which can be built like a usual electric or electronic component in electrical circuits due to the connection wires 22 and the contact capsules 21.

Alternatively, the same material of the fusible element can be used for the soldering paste 25. In that case, the mounting takes place by initially bringing in the soldering paste 25 into the corresponding contact capsules 21 and heating it up until the material of the soldering paste melts. Subsequently, the corresponding ends of the fusible element 23 are inserted into the capsules until they come into contact with the soldering paste and simultaneously or slightly before the heat source for melting the soldering paste 25 is removed, so that the fusible element 23 is only shortly melted at its ends due to the remaining heat and then connected solidly with the contact capsule 21 by the consolidated soldering paste 25 due to the quick temperature drop of the melted malted paste 25. By this means, it is possible to create such a fusible element 23 only when using a unique soldering material.

The invention claimed is:

1. A thermal fuse in a circuit structure with several circuit areas with connections sites and a fusible element that is electrically and mechanically connected to the connection sites of a soldering flux core circuit structure, wherein a material of the fusible element has a melting temperature so that the material of the fusible element melts when an ambient temperature is higher than the melting temperature, and so that the material of the fusible element accumulates at the connections sites due to a surface tension and breaks the electrical connection that is created by the fusible element, wherein the connection sites are arranged at corresponding contact bridges of the circuit structure, wherein the circuit structure comprises at least one idle power section that does not contribute to current supply, the at least one idle power section positioned on a line arm section of the circuit structure which extends along a side of the corresponding contact bridges, wherein the at least one idle power sections are connected with conductor paths that lead to the corresponding contact bridges, the conductor paths arranged traversely to a connection direction of the fusible element, and wherein the circuit structure is surrounded by a sheathing, wherein the at least one idle power section is arranged and configured as a relief structure which ensures a fixing in the sheating, so that mechanical tensions are released by the relief structures to the sheathing.

2. The thermal fuse of claim 1, wherein the connection sites are separated at a distance from each other such that the melted material of the fusible element is electrically separated at the connection sites.

3. The thermal fuse of claim 1, wherein the fusible element is one of: soldered; welded; and glued to the connection sites.

4. The thermal fuse of claim 1, wherein at least one of: the fusible element is covered with a soldering flux; and a soldering flux core is provided in the material of the fusible element or an interlayer between two layers of the material of the fusible element.

5. The thermal fuse of claim 1 wherein the circuit structure is embedded in a sheathing.

6. The thermal fuse of claim 1 wherein the circuit structure is a punched grid.

* * * * *